(12) United States Patent
Zhou et al.

(10) Patent No.: US 11,114,475 B2
(45) Date of Patent: Sep. 7, 2021

(54) IPS THIN-FILM TRANSISTOR ARRAY SUBSTRATE AND MANUFACTURING METHOD THEREOF

(71) Applicant: Shenzhen China Star Optoelectronics Semiconductor Display Technology Co., Ltd., Shenzhen (CN)

(72) Inventors: Zhichao Zhou, Shenzhen (CN); Hui Xia, Shenzhen (CN); Meng Chen, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 222 days.

(21) Appl. No.: 15/744,067

(22) PCT Filed: Dec. 20, 2017

(86) PCT No.: PCT/CN2017/117344
§ 371 (c)(1),
(2) Date: Jan. 12, 2018

(87) PCT Pub. No.: WO2019/100494
PCT Pub. Date: May 31, 2019

(65) Prior Publication Data
US 2019/0157317 A1 May 23, 2019

(30) Foreign Application Priority Data
Nov. 22, 2017 (CN) .......................... 201711177291.1

(51) Int. Cl.
*H01L 27/12* (2006.01)
*G02F 1/1362* (2006.01)
(Continued)

(52) U.S. Cl.
CPC ........ *H01L 27/1288* (2013.01); *G02F 1/1368* (2013.01); *G02F 1/13439* (2013.01);
(Continued)

(58) Field of Classification Search
CPC ............... H01L 27/1288; H01L 27/124; G02F 1/136286; G02F 1/134363; G02F 1/13439; G02F 1/1368
See application file for complete search history.

(56) References Cited

U.S. PATENT DOCUMENTS

2001/0048491 A1* 12/2001 Tanaka ............... G02F 1/136209
349/44
2003/0193639 A1* 10/2003 Nagano ............. G02F 1/134363
349/141
(Continued)

*Primary Examiner* — Quoc D Hoang
(74) *Attorney, Agent, or Firm* — Leong C. Lei

(57) ABSTRACT

The present invention provides an IPS TFT array substrate and a manufacturing method thereof. The manufacturing method of an IPS TFT array substrate of the present invention includes: forming a gate electrode, a scan line, a pixel electrode, and a common electrode with a first mask-involved operation, forming a first through hole and a second through hole in the gate insulation layer and an active layer with a second mask-involved operation, and forming a source electrode, a drain electrode, a data line, and a common electrode line with a third mask-involved operation. The present invention uses only three mask-involved operations to complete the manufacturing of an IPS TFT array substrate. Compared to the state of the art, the number of masks used is reduced, the manufacturing time is shortened, and thus the manufacturing cost is lowered. The IPS TFT array substrate of the present invention has a simple manufacturing process, a low manufacturing cost, and excellent electrical properties.

11 Claims, 13 Drawing Sheets

(51) Int. Cl.
*G02F 1/1343* (2006.01)
*G02F 1/1368* (2006.01)

(52) U.S. Cl.
CPC .. *G02F 1/134363* (2013.01); *G02F 1/136227* (2013.01); *G02F 1/136286* (2013.01); *H01L 27/124* (2013.01); *H01L 27/1259* (2013.01); *G02F 1/134318* (2021.01); *G02F 1/136236* (2021.01); *G02F 1/136295* (2021.01); *G02F 2201/121* (2013.01); *G02F 2201/123* (2013.01); *G02F 2201/124* (2013.01)

(56) References Cited

U.S. PATENT DOCUMENTS

| | | | |
|---|---|---|---|
| 2005/0250262 A1* | 11/2005 | Suzuki | H01L 29/4908 438/151 |
| 2009/0284677 A1* | 11/2009 | Shin | G02F 1/134363 349/46 |

* cited by examiner

IPS THIN-FILM TRANSISTOR ARRAY SUBSTRATE AND MANUFACTURING METHOD THEREOF

BACKGROUND OF THE INVENTION

1. Field of the Invention

The present invention relates to the field of display technology, and more particular to an in-plane switching (IPS) thin-film transistor (TFT) array substrate and a manufacturing method thereof.

2. The Related Arts

With the progress of the display technology, liquid crystal displays (LCDs), due to various advantages, such as high image quality, low power consumption, thin device body, and wide range of applications, have been widely used in all sorts of consumer electronic products, including mobile phones, televisions, personal digital assistants (PDAs), digital cameras, notebook computers, and desktop computers, and are becoming a main stream of the display devices.

Most of the liquid crystal display devices that are currently available in the market are backlighting LCDs, which comprise a liquid crystal panel and a backlight module.

The liquid crystal display panel is generally made up of a color filter (CF) substrate, a thin-film transistor (TFT) substrate, liquid crystal (LC) interposed between the CF substrate and the TFT substrate, and sealant.

Based on the direction of an electric field that is applied to drive the liquid crystal, the TFT-LCDs can be classified as a vertical electric field mode and a horizontal electric field mode. Among these modes, the vertical electric field TFT-LCDs require a pixel electrode to be formed on a TFT array substrate and a common electrode to be formed on a CF substrate; while the horizontal electric field TFT-LCDs require both a pixel electrode and a common electrode to be formed on the TFT array substrate. The vertical electric field TFT-LCDs include twist nematic (TN) TFT-LCDs and the horizontal electric field TFT-LCDs include fringe field switching (FFS) TFT-LCDs and in-plane switching (IPS) TFT-LCDs. The horizontal electric field TFT-LCDs, particularly IPS TFT-LCDs, have the advantages of fast response speed, large viewable angle, and true color and are widely used in the field of liquid crystal displays. However, the state-of-the-art ISP TFT array substrate requires at least four mask-involved operations in fabrication. Since the masks have a high fabrication cost and a process including multiple mask-involved operations needs an extended time period of fabrication. Thus, the fabrication cost of the IPS TFT array substrate is relatively high.

SUMMARY OF THE INVENTION

Objectives of the present invention are to provide a method for manufacturing an in-plane switching (IPS) thin-film transistor (TFT) array substrate, which includes a reduced number of mask-involved operations and has a low manufacturing cost.

Objectives of the present invention are also to provide an IPS TFT array substrate, which has a simple manufacturing operation and a low manufacturing cost and demonstrates excellent electrical properties.

To achieve the above objectives, the present invention provides a method for manufacturing an IPS TFT array substrate, which comprises the following steps:

S1: providing a backing plate and forming a gate electrode, a scan line, a pixel electrode, and a common electrode on the backing plate with a first mask-involved operation, wherein the scan line and the gate electrode are connected to each other;

S2: depositing a gate insulation layer on the gate electrode, the scan line, the pixel electrode, the common electrode, and the backing plate, depositing a semiconductor layer on the gate insulation layer, and subjecting the gate insulation layer and the semiconductor layer to patterning treatment with a second mask-involved operation to form a first through hole and a second through hole in the gate insulation layer and an active layer located above and corresponding to the gate electrode, wherein the first through hole and the second through hole are respectively corresponding to and located above the pixel electrode and the common electrode; and S3: depositing a source-drain metal layer on the active layer and the gate insulation layer and subjecting the source-drain metal layer to patterning treatment with a third mask-involved operation so as to form a source electrode, a drain electrode, a data line, and a common electrode line, wherein the source electrode and the drain electrode are respectively in contact engagement with two sides of the active layer; the data line and the source electrode are connected to each other; the drain electrode is connected through the first through hole of the gate insulation layer to the pixel electrode; and the common electrode line is connected through the second through hole of the gate insulation layer to the common electrode.

Step S1 comprises:

S11: depositing a first metal layer on the backing plate with physical vapor deposition;

S12: subjecting the first metal layer to patterning treatment with the first mask-involved operation to form a predetermined gate electrode pattern and a predetermined scan line pattern, and the pixel electrode and the common electrode; and S13: coating a second metal layer on the predetermined gate electrode pattern and the predetermined scan line pattern to form the gate electrode and the scan line, wherein the second metal layer has electrical conductance greater than electrical conductance of the first metal layer.

The first metal layer is formed of a material comprising one or multiple ones of molybdenum, molybdenum-titanium alloy, indium tin oxide, molybdenum-tungsten alloy, molybdenum-tantalum alloy, and molybdenum-niobium alloy.

The second metal layer is formed of a material comprising copper.

An operation of coating the second metal layer on the predetermined gate electrode pattern and the predetermined scan line pattern comprises electrical plating.

The second mask-involved operation comprises a half-tone mask based operation and Step S2 comprises S21: depositing the gate insulation layer on the gate electrode, the scan line, the pixel electrode, the common electrode, and the backing plate and depositing the semiconductor layer on the gate insulation layer; and coating a photoresist layer on the semiconductor layer, subjecting the photoresist layer to exposure and development with a half-tone mask, forming, in the photoresist layer, a first via that corresponds to and is located above the pixel electrode and a second via that corresponds to and is located above the common electrode, and a bump that corresponds to and is located above the gate electrode;

S22: subjecting the gate insulation layer and the semiconductor layer to etching with the photoresist layer as a barrier layer so as to form a third via and a fourth via extending through the gate insulation layer and the semiconductor layer, wherein the third via and the fourth via respectively correspond to the first via and the second via;

S23: subjecting the photoresist layer to ashing treatment to thin a portion of the photoresist layer corresponding to the bump and remove a remaining area of the photoresist layer;

S24: subjecting the semiconductor layer to etching with the portion of the photoresist layer corresponding to the bump as a barrier layer so as to form an active layer that is located above and corresponds to the gate electrode, and an upper section of each of the third via and the fourth via that is located in the semiconductor layer is removed so as to convert into the first through hole and the second through hole located in the gate insulation layer, respectively; and S25: removing a remaining portion of the photoresist layer.

The half-tone mask comprises a first area that corresponds to the first via and the second via, a second area that corresponds to the bump, and a third area other than the first area and the second area, wherein the first area has light transmittance greater than light transmittance of the third area and the light transmittance of the third area is greater than light transmittance of the second area; and the photoresist layer comprises a positive photoresist material.

The light transmittance of the first area is 100%, the light transmittance of the second area is 0, and the light transmittance of the third area is 0-100%.

The present invention also provides an IPS TFT array substrate, which comprises:

a backing plate;

a gate electrode, a scan line, a pixel electrode, and a common electrode that are arranged on the backing plate, wherein the scan line and the gate electrode are connected to each other;

a gate insulation layer that is arranged on the gate electrode, the scan line, the pixel electrode, and the common electrode, wherein the gate insulation layer is formed with a first through hole that is located above and corresponds to the pixel electrode and a second through hole that is located above and corresponds to the common electrode;

an active layer that is arranged on the gate insulation layer and is located above and corresponds to the gate electrode; and a source electrode and a drain electrode that are arranged on the active layer and the gate insulation layer and a data line and a common electrode line that are arranged on the gate insulation layer, wherein the source electrode and the drain electrode are respectively in contact engagement with two sides of the active layer; the data line and the source electrode are connected to each other; the drain electrode is connected through the first through hole of the gate insulation layer to the pixel electrode; and the common electrode line is connected through the second through hole of the gate insulation layer to the common electrode.

The pixel electrode and the common electrode each comprise a first metal layer arranged on the backing plate and the gate electrode and the scan line each comprise a first metal layer arranged on the backing plate and a second metal layer arranged on the first metal layer, wherein electrical conductance of the second metal layer is greater than electrical conductance of the first metal layer;

the first metal layer is formed of a material comprising one or multiple ones of molybdenum, molybdenum-titanium alloy, indium tin oxide, molybdenum-tungsten alloy, molybdenum-tantalum alloy, and molybdenum-niobium alloy; and the second metal layer is formed of a material comprising copper.

The present invention further provides a method for manufacturing an IPS TFT array substrate, which comprises the following steps:

S1: providing a backing plate and forming a gate electrode, a scan line, a pixel electrode, and a common electrode on the backing plate with a first mask-involved operation, wherein the scan line and the gate electrode are connected to each other;

S2: depositing a gate insulation layer on the gate electrode, the scan line, the pixel electrode, the common electrode, and the backing plate, depositing a semiconductor layer on the gate insulation layer, and subjecting the gate insulation layer and the semiconductor layer to patterning treatment with a second mask-involved operation to form a first through hole and a second through hole in the gate insulation layer and an active layer located above and corresponding to the gate electrode, wherein the first through hole and the second through hole are respectively corresponding to and located above the pixel electrode and the common electrode; and S3: depositing a source-drain metal layer on the active layer and the gate insulation layer and subjecting the source-drain metal layer to patterning treatment with a third mask-involved operation so as to form a source electrode, a drain electrode, a data line, and a common electrode line, wherein the source electrode and the drain electrode are respectively in contact engagement with two sides of the active layer; the data line and the source electrode are connected to each other; the drain electrode is connected through the first through hole of the gate insulation layer to the pixel electrode; and the common electrode line is connected through the second through hole of the gate insulation layer to the common electrode;

wherein Step S1 comprises:

S11: depositing a first metal layer on the backing plate with physical vapor deposition;

S12: subjecting the first metal layer to patterning treatment with the first mask-involved operation to form a predetermined gate electrode pattern and a predetermined scan line pattern, and the pixel electrode and the common electrode; and S13: coating a second metal layer on the predetermined gate electrode pattern and the predetermined scan line pattern to form the gate electrode and the scan line, wherein the second metal layer has electrical conductance greater than electrical conductance of the first metal layer;

wherein the first metal layer is formed of a material comprising one or multiple ones of molybdenum, molybdenum-titanium alloy, indium tin oxide, molybdenum-tungsten alloy, molybdenum-tantalum alloy, and molybdenum-niobium alloy;

wherein the second metal layer is formed of a material comprising copper; and wherein an operation of coating the second metal layer on the predetermined gate electrode pattern and the predetermined scan line pattern comprises electrical plating.

The efficacy of the present invention is that the method for manufacturing an IPS TFT array substrate according to the present invention can be done with only three mask-involved operations. Compared to the state of the art, the number of masks used is reduced, the manufacturing time is shortened, and thus the manufacturing cost is lowered. The IPS TFT array substrate of the present invention that is manufactured with the above method has a simple manufacturing process, a low manufacturing cost, and excellent electrical properties.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
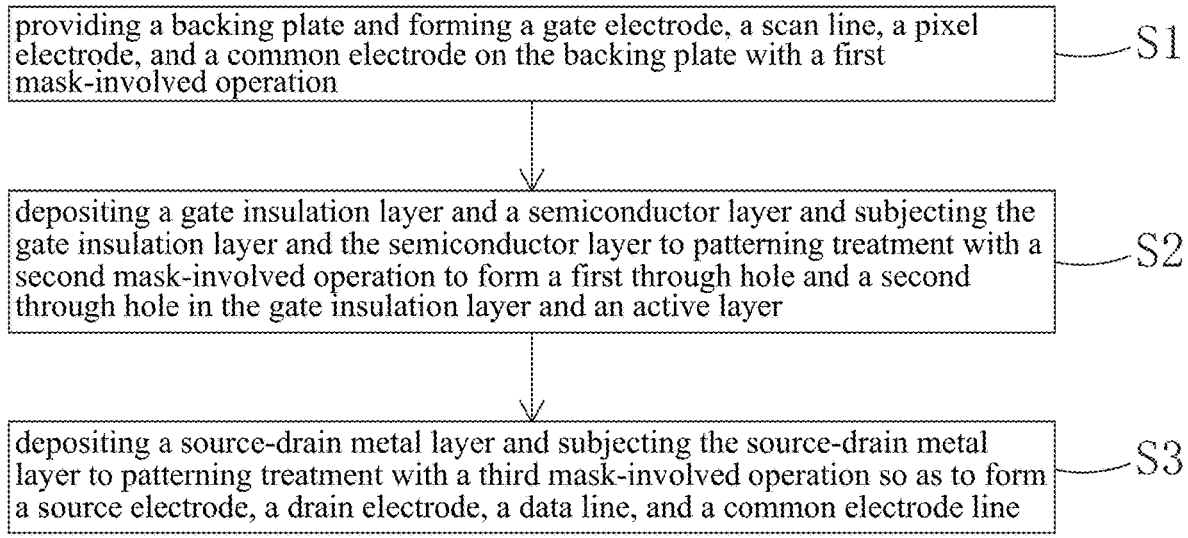
FIG. 1 is a flow chart illustrating a method for manufacturing an in-plane switching (IPS) thin-film transistor (TFT) array substrate according to the present invention.

Referring to FIG. 1, the present invention provides a method for manufacturing an in-plane switching (IPS) thin-film transistor (TFT) array substrate, which comprises the following steps:

S1: as shown in FIGS. 2-6b, providing a backing plate 10 and forming a gate electrode 21, a scan line 22, a pixel electrode 23, and a common electrode 24 on the backing plate 10 with a first mask-involved operation, wherein the scan line 22 and the gate electrode 21 are connected to each other.

Figure 2:
FIG. 2 is a schematic view illustrating Step S11 of the method for manufacturing an IPS TFT array substrate according to the present invention.
Figure 3:
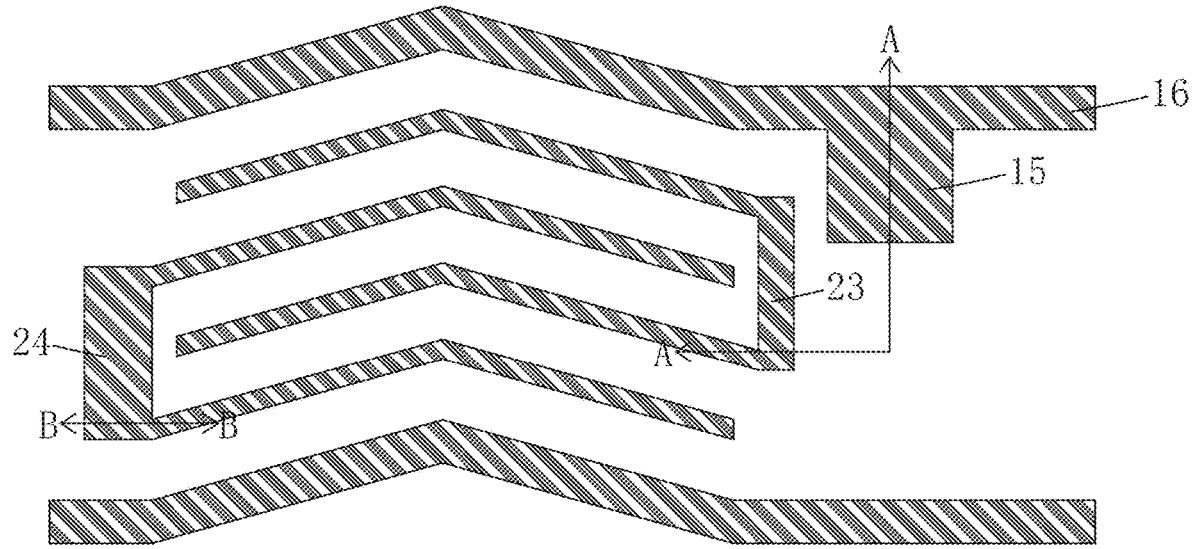
FIG. 3 is a top plan view illustrating Step S12 of the method for manufacturing an IPS TFT array substrate according to the present invention.
Figure 4A:
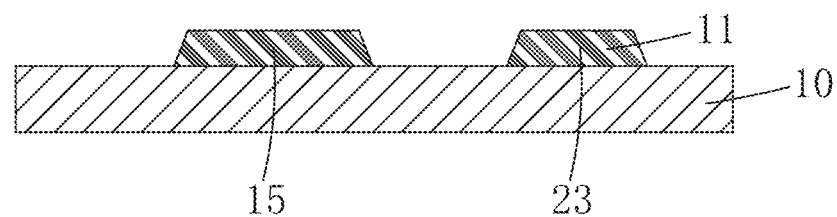
FIG. 4a is a cross-sectional view taken along line A-A of FIG. 3.
Figure 4B:
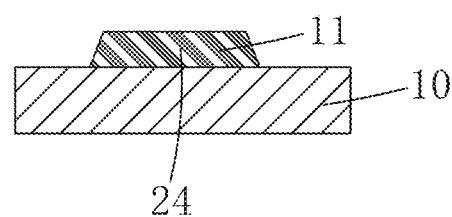
FIG. 4b is a cross-sectional view taken along line B-B of FIG. 3.
Figure 5:
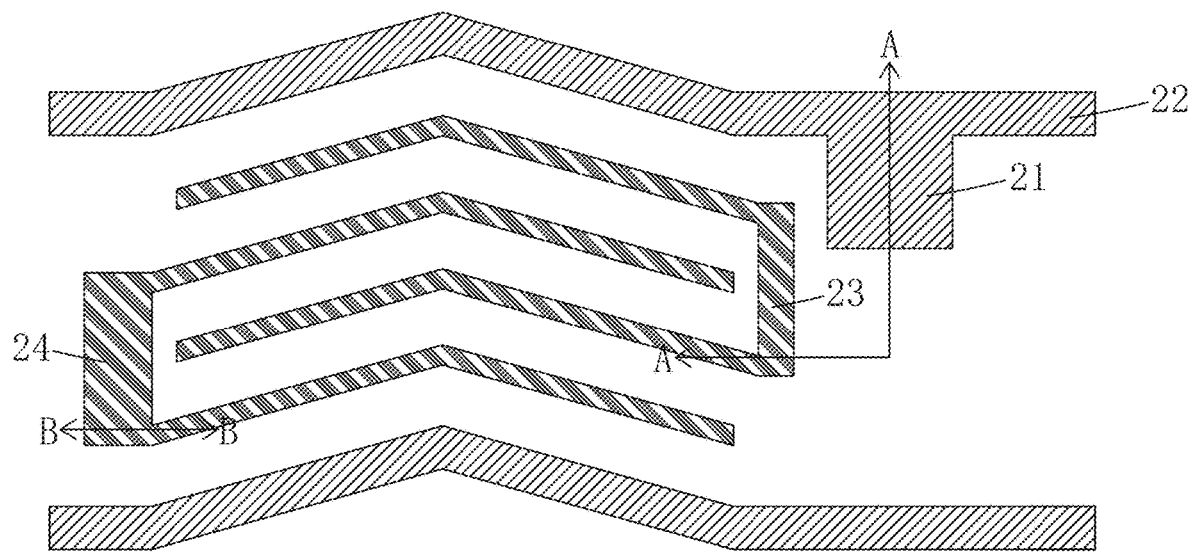
FIG. 5 is a top plan view illustrating Step S13 of the method for manufacturing an IPS TFT array substrate according to the present invention.
Figure 6A:
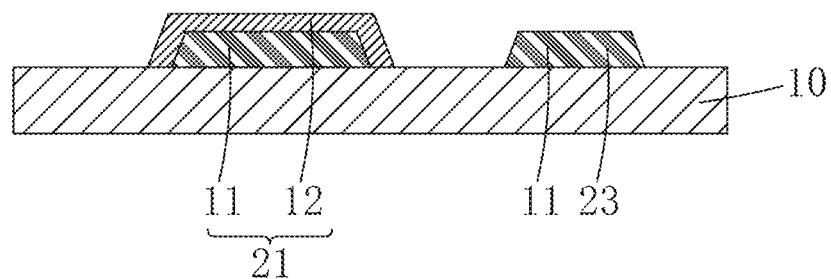
FIG. 6a is a cross-sectional view taken along line A-A of FIG. 5.
Figure 6B:
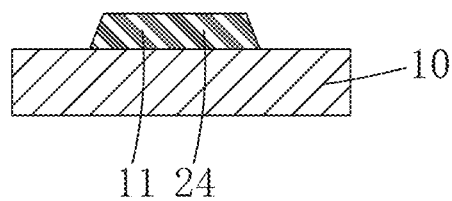
FIG. 6b is a cross-sectional view taken along line B-B of FIG. 5.

Specifically, Step S1 comprises:

S11: as shown in FIG. 2, depositing a first metal layer 11 on the backing plate 10 with physical vapor deposition (PVD);

S12: as shown in FIGS. 3, 4a, and 4b, subjecting the first metal layer 11 to patterning treatment with the first mask-involved operation to form a predetermined gate electrode pattern 15 and a predetermined scan line pattern 16, and the pixel electrode 23 and the common electrode 24;

S13: as shown in FIGS. 5, 6a, and 6b, coating a second metal layer 12 on the predetermined gate electrode pattern 15 and the predetermined scan line pattern 16 to form the gate electrode 21 and the scan line 22, wherein the second metal layer 12 has electrical conductance greater than electrical conductance of the first metal layer 11.

Specifically, the first metal layer 11 is formed of a material comprising one or multiple ones of molybdenum (Mo), molybdenum-titanium alloy (MoTi), indium tin oxide (ITO), molybdenum-tungsten alloy (MoW), molybdenum-tantalum alloy (MoTa), and molybdenum-niobium alloy (MoNb).

Specifically, the second metal layer 12 is formed of a material comprising copper.

Since the pixel electrode 23 and the common electrode 24 do no necessarily have a low resistance, it is sufficient to meet the need for electrical property for them by making them with the first metal layer 11; while the gate electrode 21 and the scan line 22 require a low resistance so that coating the second metal layer 12 (preferably copper) having better electrical conductance on the first metal layer 11 to make the gate electrode 21 and the scan line 22 could reduce electrical resistances thereof to meet the their needs for electrical property. Specifically, an operation that could be used to coat the second metal layer 12 on the predetermined gate electrode pattern 15 and the predetermined scan line pattern 16 is an electrical plating operation. During the electrical plating operation, electricity is applied to the predetermined gate electrode pattern 15 and the predetermined scan line pattern 16, but not to the pixel electrode 23 and the common electrode 24, so that it is possible to coat the second metal layer 12 on the predetermined gate electrode pattern 15 and the predetermined scan line pattern 16 but not to coat the second metal layer 12 on the pixel electrode 23 and the common electrode 24.

Specifically, the backing plate 10 comprises a glass substrate.

Specifically, the first mask-involved operation comprises operations of photoresist coating, exposure, development, wet etching, and photoresist removal.

Specifically, the present invention takes advantages of coating the second metal layer 12 on the predetermined gate electrode pattern 15 and the predetermined scan line pattern 16 to improve conducting performance of the gate electrode 21 and the scan line 22 so formed.

Figure 7:
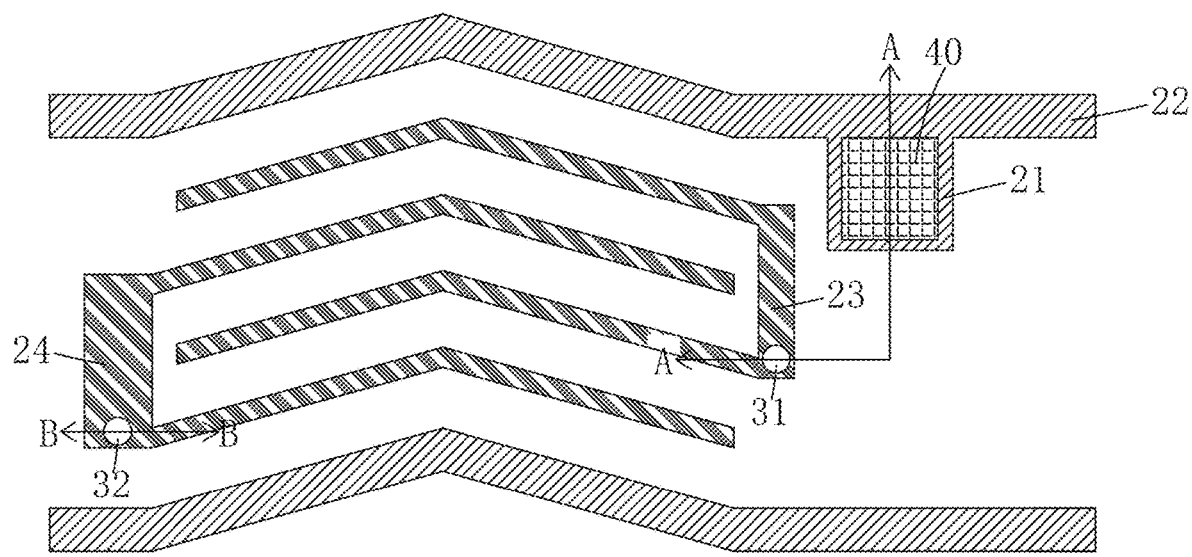
FIG. 7 is a top plan view illustrating Step S2 of the method for manufacturing an IPS TFT array substrate according to the present invention.
Figure 8A:
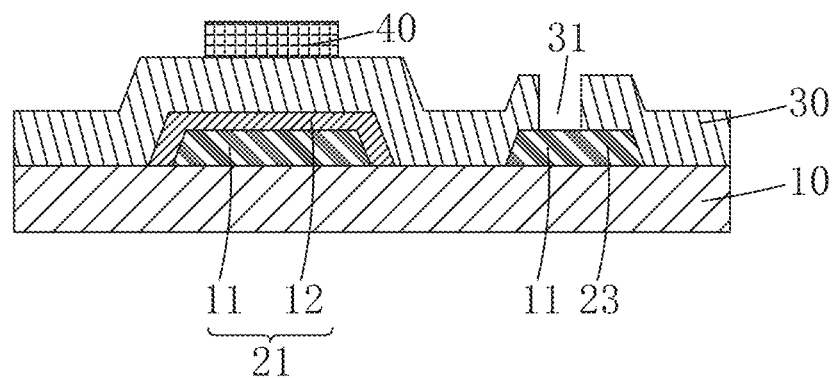
FIG. 8a is a cross-sectional view taken along line A-A of FIG. 7.
Figure 8B:
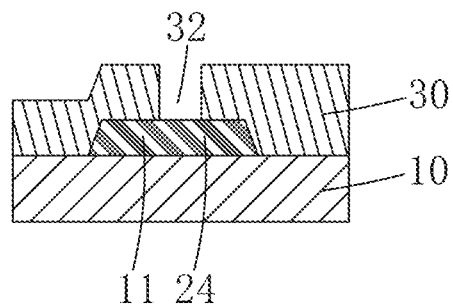
FIG. 8b is a cross-sectional view taken along line B-B of FIG. 7.

S2: as shown in FIGS. 7, 8a, and 8b, depositing a gate insulation layer 30 on the gate electrode 21, the scan line 22, the pixel electrode 23, the common electrode 24, and the backing plate 10, depositing a semiconductor layer 35 on the gate insulation layer 30, and subjecting the gate insulation layer 30 and the semiconductor layer 35 to patterning treatment with a second mask-involved operation to form a first through hole 31 and a second through hole 32 in the gate insulation layer 30 and an active layer 40 located above and corresponding to the gate electrode 21, wherein the first through hole 31 and the second through hole 32 are respectively corresponding to and located above the pixel electrode 23 and the common electrode 24.

Figure 9A:
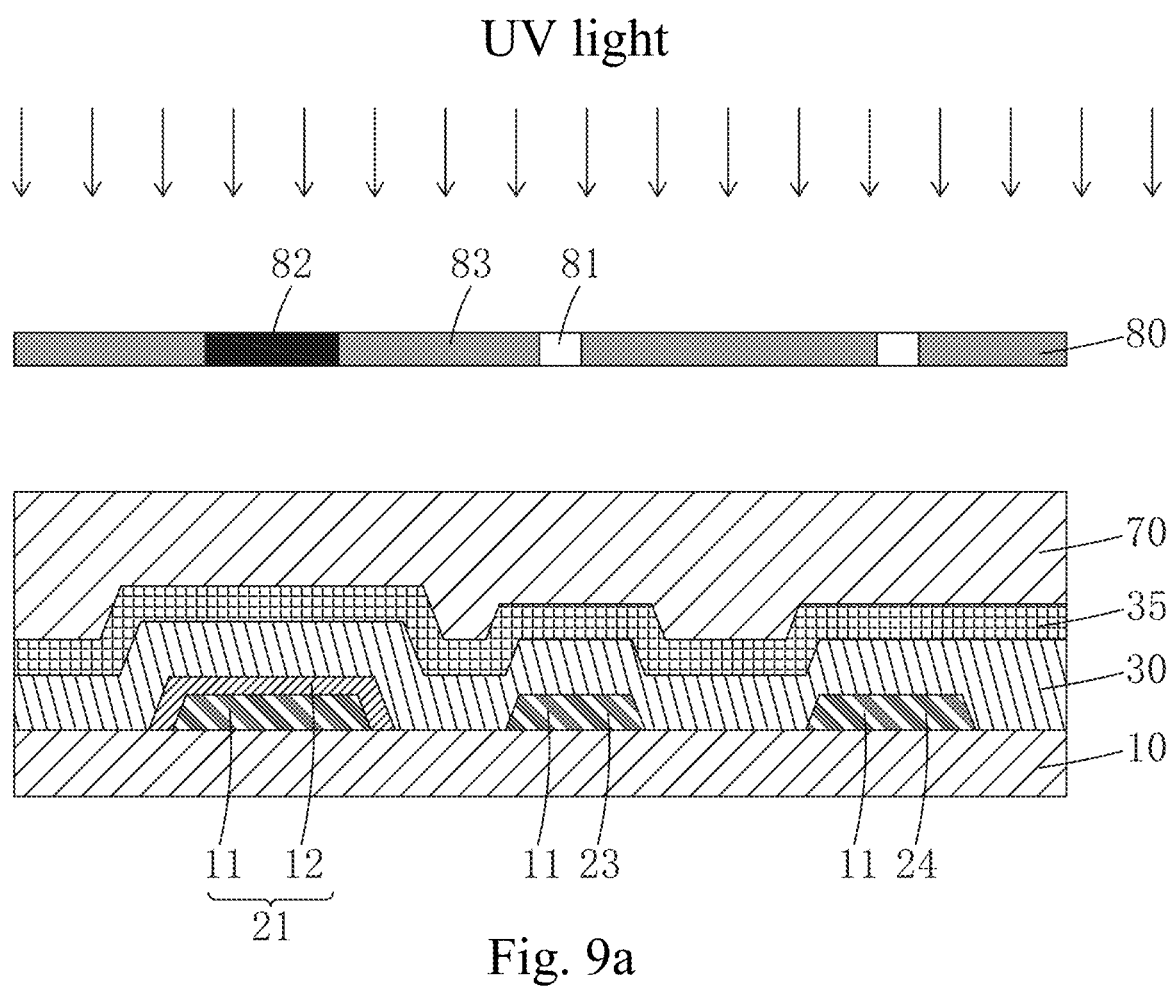
FIGS. 9a and 9b are schematic views, in a sectioned form, illustrating Step S21 of the method for manufacturing an IPS TFT array substrate according to the present invention.
Figure 9B:
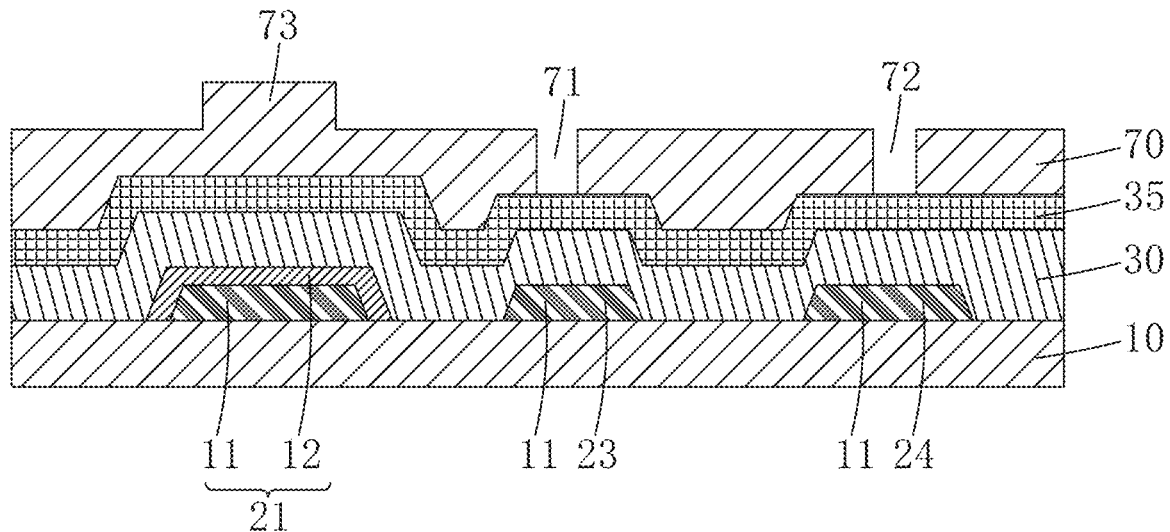

Specifically, the second mask-involved operation comprises a half-tone mask based operation. Step S2 specifically comprises:

S21: as shown in FIGS. 9a-9b, depositing the gate insulation layer 30 on the gate electrode 21, the scan line 22, the pixel electrode 23, the common electrode 24, and the backing plate 10 and depositing the semiconductor layer 35 on the gate insulation layer 30; and coating a photoresist layer 70 on the semiconductor layer 35, subjecting the photoresist layer 70 to exposure and development with a half-tone mask 80, forming, in the photoresist layer 70, a first via 71 that corresponds to and is located above the pixel electrode 23 and a second via 72 that corresponds to and is located above the common electrode 24, and a bump 73 that corresponds to and is located above the gate electrode 21.

Specifically, the half-tone mask 80 comprises a first area 81 that corresponds to the first via 71 and the second via 72, a second area 82 that corresponds to the bump 73, and a third area 83 other than the first area 81 and the second area 82, wherein the first area 81 has light transmittance greater than light transmittance of the third area 83 and the light transmittance of the third area 83 is greater than light transmittance of the second area 82. The photoresist layer 70 comprises a positive photoresist material.

Preferably, the light transmittance of the first area 81 is 100%, the light transmittance of the second area 82 is 0, and the light transmittance of the third area 83 is 0-100%.

Figure 9C:
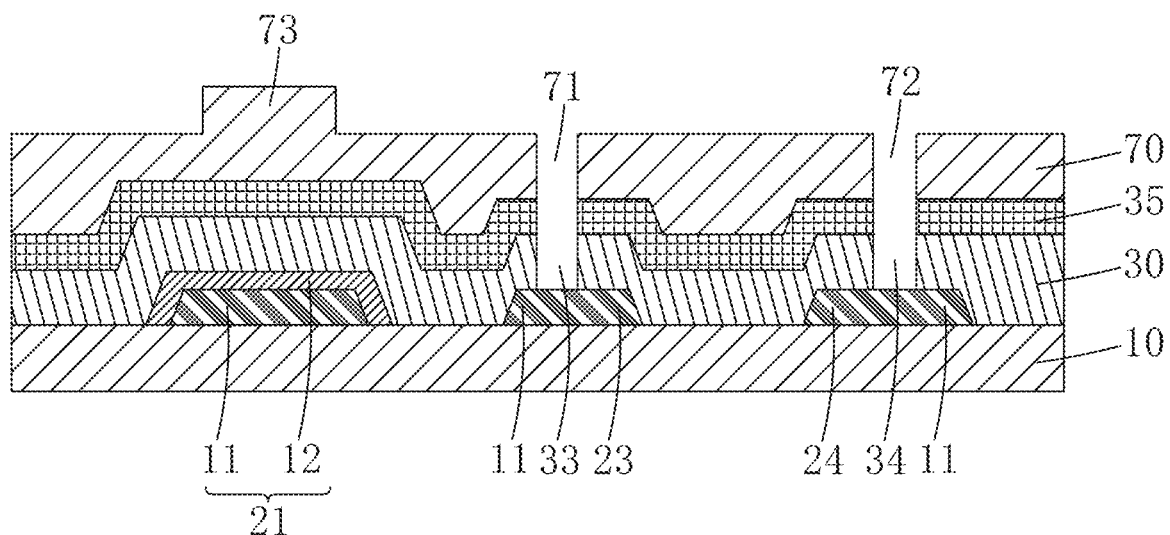
FIG. 9c is a schematic view, in a sectioned form, illustrating Step S22 of the method for manufacturing an IPS TFT array substrate according to the present invention.

S22: as shown in FIG. 9c, subjecting the gate insulation layer 30 and the semiconductor layer 35 to etching with the photoresist layer 70 as a barrier layer so as to form a third via 33 and a fourth via 74 extending through the gate insulation layer 30 and the semiconductor layer 35, wherein the third via 33 and the fourth via 74 respectively correspond to the first via 71 and the second via 72.

Figure 9D:
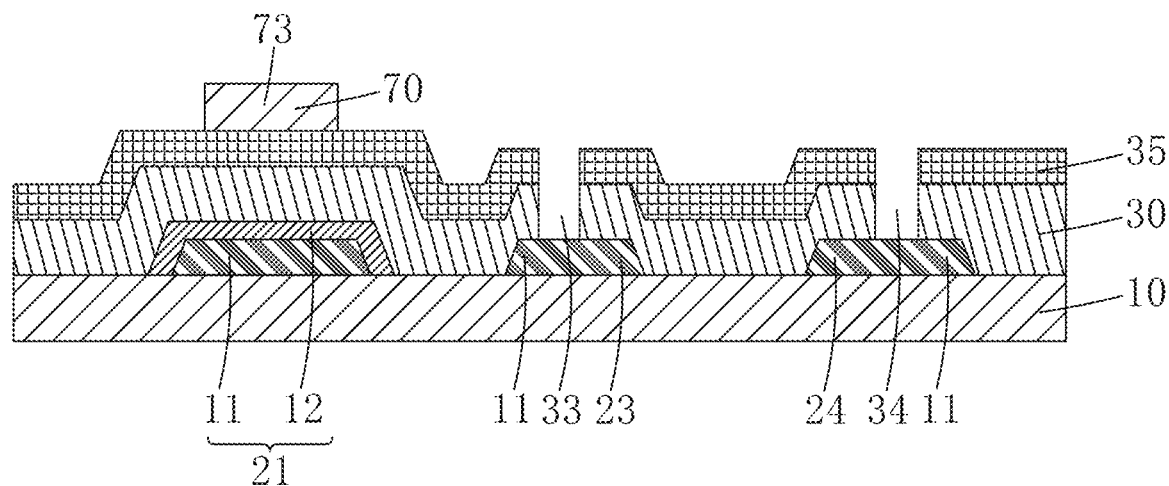
FIG. 9d is a schematic view, in a sectioned form, illustrating Step S23 of the method for manufacturing an IPS TFT array substrate according to the present invention.

S23: as shown in FIG. 9d, subjecting the photoresist layer 70 to ashing treatment to thin a portion of the photoresist layer 70 corresponding to the bump 73 and remove a remaining area of the photoresist layer.

Figure 9E:
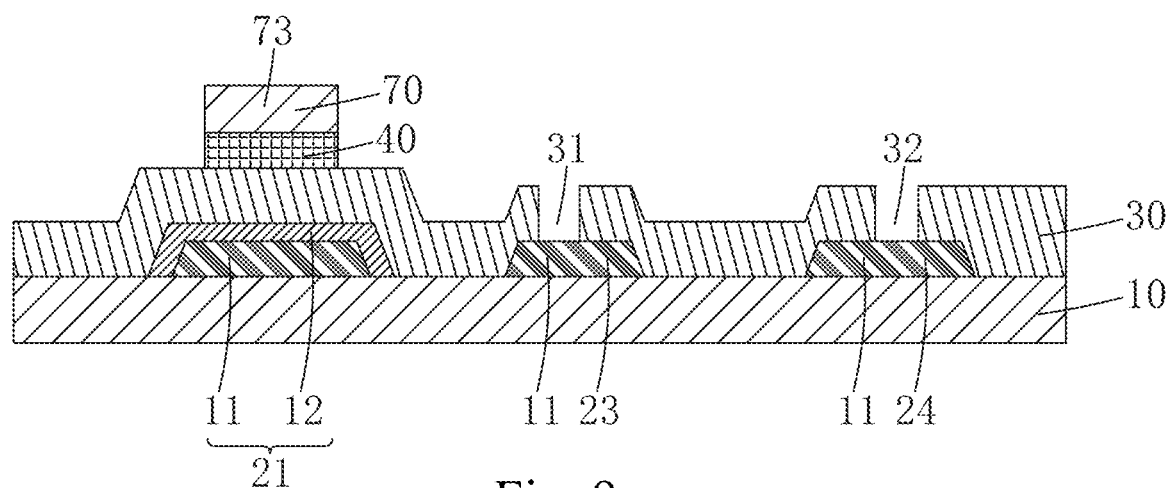
FIG. 9e is a schematic view, in a sectioned form, illustrating Step S24 of the method for manufacturing an IPS TFT array substrate according to the present invention.

S24: as shown in FIG. 9e, subjecting the semiconductor layer 35 to etching with the portion of the photoresist layer 70 corresponding to the bump 73 as a barrier layer so as to form an active layer 40 that is located above and corresponds to the gate electrode 21, and an upper section of each of the third via 33 and the fourth via 74 that is located in the semiconductor layer 35 is removed so as to convert into the first through hole 31 and the second through hole 32 located in the gate insulation layer 30, respectively.

Figure 9F:
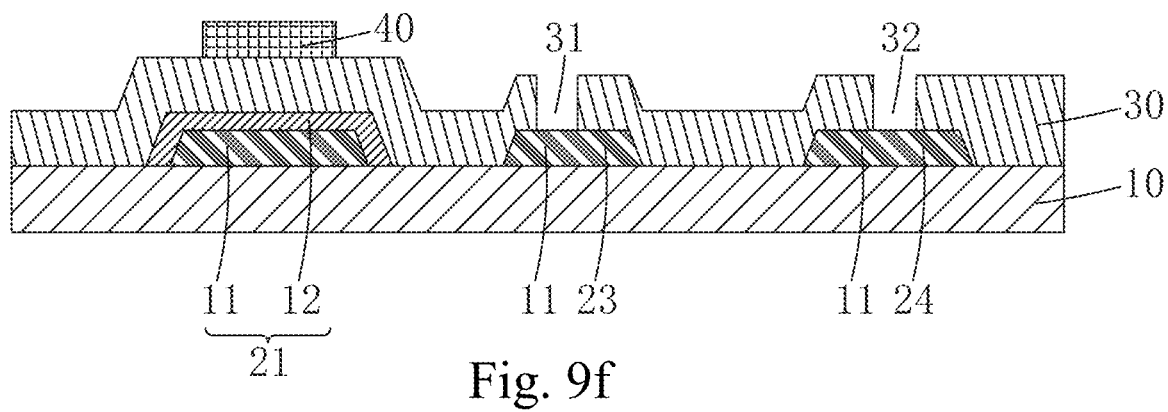
FIG. 9f is a schematic view, in a sectioned form, illustrating Step S25 of the method for manufacturing an IPS TFT array substrate according to the present invention.

S25: as shown in FIG. 9f, removing a remaining portion of the photoresist layer 70.

Specifically, the gate insulation layer 30 is formed of a material comprising silicon oxide ($SiO_x$) and silicon nitride ($SiN_x$).

Specifically, the semiconductor layer 35 is formed of a material comprising one or multiple ones of amorphous silicon, poly-silicon, and a metal oxide.

Specifically, deposition of each of the gate insulation layer 30 and the semiconductor layer 35 comprises chemical vapor deposition (CVD).

Figure 10:
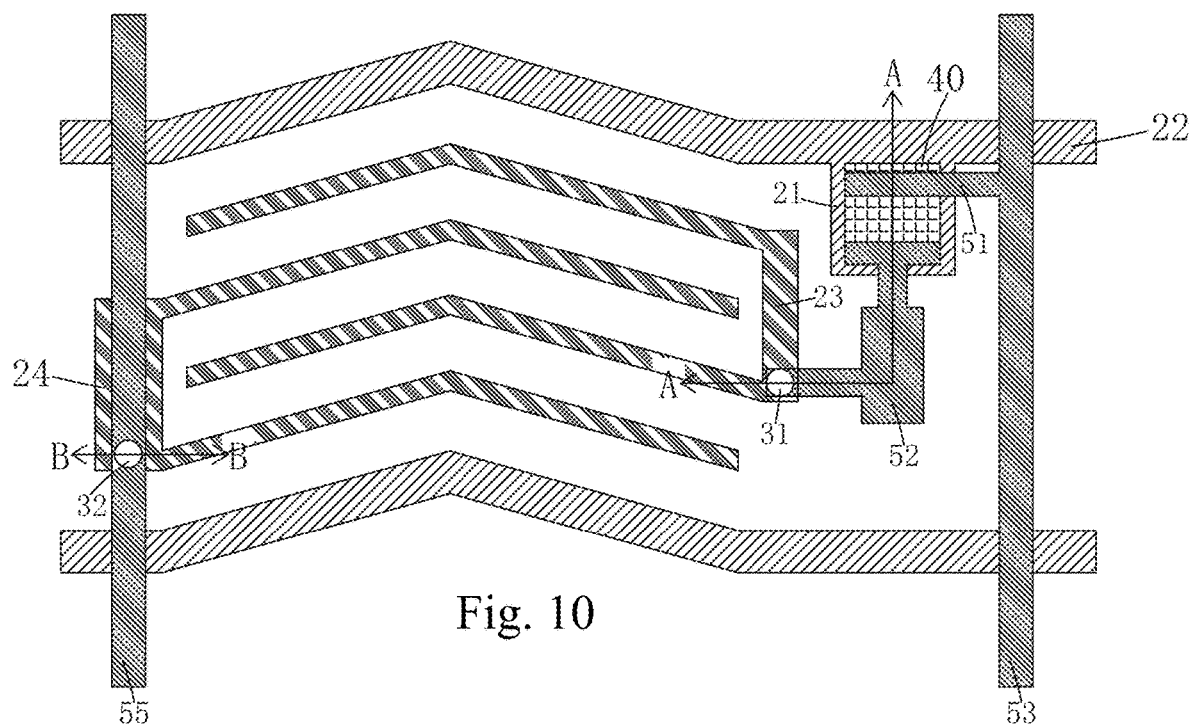
FIG. 10 is a top plan view illustrating Step S3 of the method for manufacturing an IPS TFT array substrate according to the present invention.
Figure 11A:
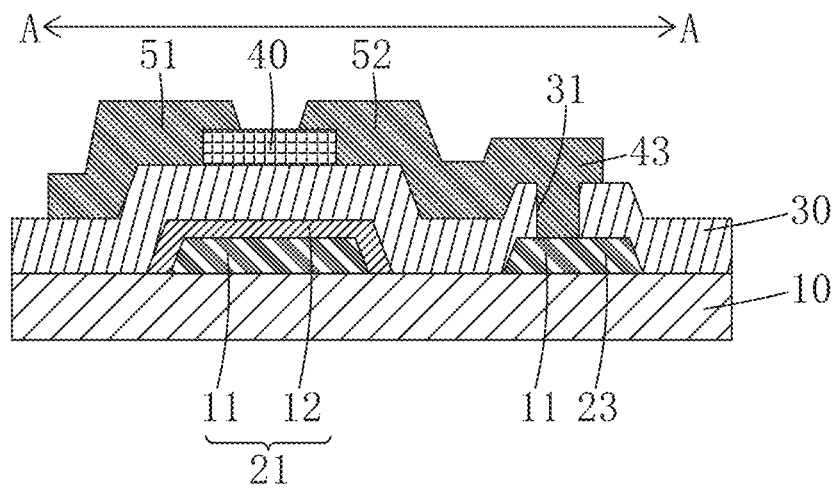
FIG. 11a is a cross-sectional view taken along line A-A of FIG. 10.
Figure 11B:
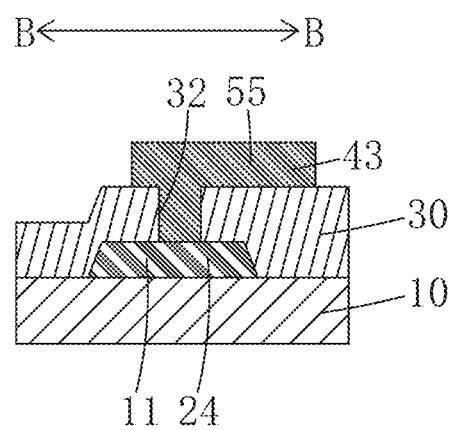
FIG. 11b is a cross-sectional view taken along line B-B of FIG. 10.

S3: as shown in FIGS. 10, 11a, and 11b, depositing a source-drain metal layer 43 on the active layer 40 and the gate insulation layer 30 and subjecting the source-drain metal layer 43 to patterning treatment with a third mask-involved operation so as to form a source electrode 51, a drain electrode 52, a data line 53, and a common electrode line 55, wherein the source electrode 51 and the drain electrode 52 are respectively in contact engagement with two sides of the active layer 40; the data line 53 and the source electrode 51 are connected to each other; the drain electrode 52 is connected through the first through hole 31 of the gate insulation layer 30 to the pixel electrode 23; and the common electrode line 55 is connected through the second through hole 32 of the gate insulation layer 30 to the common electrode 24. To this point, manufacturing of the IPS TFT array substrate according to the present invention is completed.

Specifically, deposition of the source-drain metal layer 43 comprises physical vapor deposition (PVD).

Specifically, the third mask-involved operation comprises operations of photoresist coating, exposure, development, wet etching, and photoresist removal.

The method for manufacturing an IPS TFT array substrate as described above can be done with only three mask-involved operations. Compared to the state of the art, the number of masks used is reduced, the manufacturing time is shortened, and thus the manufacturing cost is lowered.

Referring to FIGS. 10, 11a, and 11b, based on the above-described method for manufacturing an IPS TFT array substrate, the present invention also provides an IPS TFT array substrate, which comprises:

a backing plate 10;

a gate electrode 21, a scan line 22, a pixel electrode 23, and a common electrode 24 that are arranged on the backing plate 10, wherein the scan line 22 and the gate electrode 21 are connected to each other;

a gate insulation layer 30 that is arranged on the gate electrode 21, the scan line 22, the pixel electrode 23, and the common electrode 24, wherein the gate insulation layer 30 is formed with a first through hole 31 that is located above and corresponds to the pixel electrode 23 and a second through hole 32 that is located above and corresponds to the common electrode 24;

an active layer 40 that is arranged on the gate insulation layer 30 and is located above and corresponds to the gate electrode 21; and a source electrode 51 and a drain electrode 52 that are arranged on the active layer 40 and the gate insulation layer 30 and a data line 53 and a common electrode line 55 that are arranged on the gate insulation layer 30, wherein the source electrode 51 and the drain electrode 52 are respectively in contact engagement with two sides of the active layer 40; the data line 53 and the source electrode 51 are connected to each other; the drain electrode 52 is connected through the first through hole 31 of the gate insulation layer 30 to the pixel electrode 23; and the common electrode line 55 is connected through the second through hole 32 of the gate insulation layer 30 to the common electrode 24.

Specifically, the pixel electrode 23 and the common electrode 24 comprises a first metal layer 11 that is arranged on the backing plate 10; the gate electrode 21 and the scan line 22 comprises the first metal layer 11 that is arranged on the backing plate 10 and a second metal layer 12 that is arranged on the first metal layer 11, wherein electrical conductance of the second metal layer 12 is greater than electrical conductance of the first metal layer 11.

Specifically, the first metal layer 11 is formed of a material comprising one or multiple ones of molybdenum (Mo), molybdenum-titanium alloy (MoTi), indium tin oxide (ITO), molybdenum-tungsten alloy (MoW), molybdenum-tantalum alloy (MoTa), and molybdenum-niobium alloy (MoNb).

Specifically, the second metal layer 12 is formed of a material comprising copper.

Specifically, the backing plate 10 comprises a glass substrate.

Specifically, the gate insulation layer 30 is formed of a material comprising one or multiple ones of silicon oxide ($SiO_x$) and silicon nitride ($SiN_x$).

Specifically, the active layer 40 is formed of a material comprising one or multiple ones of amorphous silicon, poly-silicon, and a metal oxide.

The IPS TFT array substrate described above has a simple manufacturing process, a low manufacturing cost, and excellent electrical properties.

In summary, the present invention provides an IPS TFT array substrate and a manufacturing method thereof. The method for manufacturing an IPS TFT array substrate according to the present invention can be done with only three mask-involved operations. Compared to the state of the art, the number of masks used is reduced, the manufacturing time is shortened, and thus the manufacturing cost is lowered. The IPS TFT array substrate of the present invention that is manufactured with the above method has a simple manufacturing process, a low manufacturing cost, and excellent electrical properties.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A method for manufacturing an in-plane switching (IPS) thin-film transistor (TFT) array substrate, comprising the following steps:
    S1: providing a backing plate and forming a gate electrode, a scan line, a pixel electrode, and a common electrode on the backing plate with a first mask-involved operation, wherein the scan line and the gate electrode are connected to each other;
    S2: depositing a gate insulation layer on the gate electrode, the scan line, the pixel electrode, the common electrode, and the backing plate, depositing a semiconductor layer on the gate insulation layer, and subjecting the gate insulation layer and the semiconductor layer to patterning treatment with a second mask-involved operation to form a first through hole and a second through hole in the gate insulation layer and an active layer located above and corresponding to the gate electrode, wherein the first through hole and the second through hole are respectively corresponding to and located above the pixel electrode and the common electrode; and
    S3: depositing a source-drain metal layer on the active layer and the gate insulation layer and subjecting the source-drain metal layer to patterning treatment with a third mask-involved operation so as to form a source electrode, a drain electrode, a data line, and a common electrode line, wherein the source electrode and the drain electrode are respectively in contact engagement with two sides of the active layer; the data line and the source electrode are connected to each other; the drain electrode is connected through the first through hole of the gate insulation layer to the pixel electrode; and the common electrode line is connected through the second through hole of the gate insulation layer to the common electrode;
    wherein Step S1 comprises:
    S11: depositing a first metal layer on the backing plate with physical vapor deposition;
    S12: subjecting the first metal layer to patterning treatment with the first mask-involved operation to form a predetermined gate electrode pattern and a predetermined scan line pattern, and the pixel electrode and the common electrode; and
    S13: carrying out an operation of coating a second metal layer on the predetermined gate electrode pattern and the predetermined scan line pattern to form the gate electrode and the scan line, wherein the second metal layer has electrical conductance greater than electrical conductance of the first metal layer; and
    wherein the first metal layer is subjected to the patterning treatment of Step S12 to form a first metal pattern that includes a first part and a second part different from the first part, the first part including the predetermined gate electrode pattern and the predetermined scan line pattern, the second part including the pixel electrode and the common electrode, wherein the operation of coating is carried out after the formation of the first metal pattern such that the second metal layer is coated on the first part of the first metal pattern to cover the first part of the first metal pattern, while the second part of the first metal pattern does not include the second metal layer coated thereon and is completely exposed outside from the second metal layer.

2. The method for manufacturing the IPS TFT array substrate according to claim 1, wherein the first metal layer is formed of a material comprising one or multiple ones of molybdenum, molybdenum-titanium alloy, indium tin oxide, molybdenum-tungsten alloy, molybdenum-tantalum alloy, and molybdenum-niobium alloy.

3. The method for manufacturing the IPS TFT array substrate according to claim 1, wherein the second metal layer is formed of a material comprising copper.

4. The method for manufacturing the IPS TFT array substrate according to claim 1, wherein an operation of coating the second metal layer on the predetermined gate electrode pattern and the predetermined scan line pattern comprises electrical plating.

5. The method for manufacturing the IPS TFT array substrate according to claim 1, wherein the second mask-involved operation comprises a half-tone mask based operation and Step S2 comprises:
    S21: depositing the gate insulation layer on the gate electrode, the scan line, the pixel electrode, the common electrode, and the backing plate and depositing the semiconductor layer on the gate insulation layer; and coating a photoresist layer on the semiconductor layer, subjecting the photoresist layer to exposure and development with a half-tone mask, forming, in the photoresist layer, a first via that corresponds to and is located above the pixel electrode and a second via that corresponds to and is located above the common electrode, and a bump that corresponds to and is located above the gate electrode;

S22: subjecting the gate insulation layer and the semiconductor layer to etching with the photoresist layer as a barrier layer so as to form a third via and a fourth via extending through the gate insulation layer and the semiconductor layer, wherein the third via and the fourth via respectively correspond to the first via and the second via;

S23: subjecting the photoresist layer to ashing treatment to thin a portion of the photoresist layer corresponding to the bump and remove a remaining area of the photoresist layer;

S24: subjecting the semiconductor layer to etching with the portion of the photoresist layer corresponding to the bump as a barrier layer so as to form an active layer that is located above and corresponds to the gate electrode, and an upper section of each of the third via and the fourth via that is located in the semiconductor layer is removed so as to convert into the first through hole and the second through hole located in the gate insulation layer, respectively; and S25: removing a remaining portion of the photoresist layer.

6. The method for manufacturing the IPS TFT array substrate according to claim 5, wherein the half-tone mask comprises a first area that corresponds to the first via and the second via, a second area that corresponds to the bump, and a third area other than the first area and the second area, wherein the first area has light transmittance greater than light transmittance of the third area and the light transmittance of the third area is greater than light transmittance of the second area; and the photoresist layer comprises a positive photoresist material.

7. The method for manufacturing the IPS TFT array substrate according to claim 6, wherein the light transmittance of the first area is 100%, the light transmittance of the second area is 0, and the light transmittance of the third area is 0-100%.

8. A method for manufacturing an in-plane switching (IPS) thin-film transistor (TFT) array substrate, comprising the following steps:

S1: providing a backing plate and forming a gate electrode, a scan line, a pixel electrode, and a common electrode on the backing plate with a first mask-involved operation, wherein the scan line and the gate electrode are connected to each other;

S2: depositing a gate insulation layer on the gate electrode, the scan line, the pixel electrode, the common electrode, and the backing plate, depositing a semiconductor layer on the gate insulation layer, and subjecting the gate insulation layer and the semiconductor layer to patterning treatment with a second mask-involved operation to form a first through hole and a second through hole in the gate insulation layer and an active layer located above and corresponding to the gate electrode, wherein the first through hole and the second through hole are respectively corresponding to and located above the pixel electrode and the common electrode; and S3: depositing a source-drain metal layer on the active layer and the gate insulation layer and subjecting the source-drain metal layer to patterning treatment with a third mask-involved operation so as to form a source electrode, a drain electrode, a data line, and a common electrode line, wherein the source electrode and the drain electrode are respectively in contact engagement with two sides of the active layer; the data line and the source electrode are connected to each other; the drain electrode is connected through the first through hole of the gate insulation layer to the pixel electrode; and the common electrode line is connected through the second through hole of the gate insulation layer to the common electrode;

wherein Step S1 comprises:

S11: depositing a first metal layer on the backing plate with physical vapor deposition;

S12: subjecting the first metal layer to patterning treatment with the first mask-involved operation to form a predetermined gate electrode pattern and a predetermined scan line pattern, and the pixel electrode and the common electrode; and S13: carrying out an operation of coating a second metal layer on the predetermined gate electrode pattern and the predetermined scan line pattern to form the gate electrode and the scan line, wherein the second metal layer has electrical conductance greater than electrical conductance of the first metal layer;

wherein the first metal layer is subjected to the patterning treatment of Step S12 to form a first metal pattern that includes a first part and a second part different from the first part, the first part including the predetermined gate electrode pattern and the predetermined scan line pattern, the second part including the pixel electrode and the common electrode, wherein the operation of coating is carried out after the formation of the first metal pattern such that the second metal layer is coated on the first part of the first metal pattern to cover the first part of the first metal pattern, while the second part of the first metal pattern does not include the second metal layer coated thereon and is completely exposed from the second metal layer;

wherein the first metal layer is formed of a material comprising one or multiple ones of molybdenum, molybdenum-titanium alloy, indium tin oxide, molybdenum-tungsten alloy, molybdenum-tantalum alloy, and molybdenum-niobium alloy;

wherein the second metal layer is formed of a material comprising copper; and wherein an operation of coating the second metal layer on the predetermined gate electrode pattern and the predetermined scan line pattern comprises electrical plating.

9. The method for manufacturing the IPS TFT array substrate according to claim 8, wherein the second mask-involved operation comprises a half-tone mask based operation and Step S2 comprises:

S21: depositing the gate insulation layer on the gate electrode, the scan line, the pixel electrode, the common electrode, and the backing plate and depositing the semiconductor layer on the gate insulation layer; and coating a photoresist layer on the semiconductor layer, subjecting the photoresist layer to exposure and development with a half-tone mask, forming, in the photoresist layer, a first via that corresponds to and is located above the pixel electrode and a second via that corresponds to and is located above the common electrode, and a bump that corresponds to and is located above the gate electrode;

S22: subjecting the gate insulation layer and the semiconductor layer to etching with the photoresist layer as a barrier layer so as to form a third via and a fourth via extending through the gate insulation layer and the semiconductor layer, wherein the third via and the fourth via respectively correspond to the first via and the second via;

S23: subjecting the photoresist layer to ashing treatment to thin a portion of the photoresist layer corresponding to the bump and remove a remaining area of the photoresist layer;

S24: subjecting the semiconductor layer to etching with the portion of the photoresist layer corresponding to the bump as a barrier layer so as to form an active layer that is located above and corresponds to the gate electrode, and an upper section of each of the third via and the fourth via that is located in the semiconductor layer is removed so as to convert into the first through hole and the second through hole located in the gate insulation layer, respectively; and S25: removing a remaining portion of the photoresist layer.

10. The method for manufacturing the IPS TFT array substrate according to claim 9, wherein the half-tone mask comprises a first area that corresponds to the first via and the second via, a second area that corresponds to the bump, and a third area 83 other than the first area and the second area, wherein the first area has light transmittance greater than light transmittance of the third area and the light transmittance of the third area is greater than light transmittance of the second area; and the photoresist layer comprises a positive photoresist material.

11. The method for manufacturing the IPS TFT array substrate according to claim 10, wherein the light transmittance of the first area is 100%, the light transmittance of the second area is 0, and the light transmittance of the third area is 0-100%.

* * * * *